(12) United States Patent
Huang et al.

(10) Patent No.: US 12,736,556 B2
(45) Date of Patent: Sep. 15, 2026

(54) METHOD AND APPARATUS FOR MEASURING ROTATIONAL SPEED OF SATELLITE DISK ON MOCVD PLANETARY SUSCEPTOR

(71) Applicant: NANCHANG ANGKUN CO., LTD., Nanchang (CN)

(72) Inventors: Wenyong Huang, Nanchang (CN); Tiezhong Ma, Nanchang (CN); Hua Yan, Nanchang (CN); Xudong Ni, Nanchang (CN)

(73) Assignee: NANCHANG ANGKUN CO., LTD., Nanchang (CN)

(*) Notice: Subject to any disclaimer, the term of this patent is extended or adjusted under 35 U.S.C. 154(b) by 1037 days.

(21) Appl. No.: 17/906,344

(22) PCT Filed: Nov. 19, 2021

(86) PCT No.: PCT/CN2021/131750
§ 371 (c)(1),
(2) Date: Jan. 12, 2023

(87) PCT Pub. No.: WO2023/279627
PCT Pub. Date: Jan. 12, 2023

(65) Prior Publication Data

US 2024/0210436 A1 Jun. 27, 2024

(30) Foreign Application Priority Data

Jul. 9, 2021 (CN) ........................ 202110775866.X

(51) Int. Cl.
*G01P 3/36* (2006.01)
*C23C 16/458* (2006.01)
*C23C 16/52* (2006.01)

(52) U.S. Cl.
CPC ............ *G01P 3/36* (2013.01); *C23C 16/4584* (2013.01); *C23C 16/52* (2013.01)

(58) Field of Classification Search
CPC ........ G01P 3/36; C23C 16/4584; C23C 16/52
See application file for complete search history.

(56) References Cited

U.S. PATENT DOCUMENTS

2013/0141711 A1* 6/2013 Hines ................ H01L 21/68764 356/28

FOREIGN PATENT DOCUMENTS

CN 110629201 A * 12/2019 ............. C23C 16/46
KR 20210073234 A * 6/2021 ....... H01L 21/68785

* cited by examiner

*Primary Examiner* — Mark Hellner
(74) *Attorney, Agent, or Firm* — Syncoda LLC; Feng Ma

(57) ABSTRACT

A method for measuring a rotational speed of a satellite disk on a MOCVD planetary susceptor includes emitting a beam of laser light on the MOCVD equipment, the laser light irradiating on the planetary susceptor of the MOCVD equipment. As the planetary susceptor is revolving, the laser light is irradiating on a satellite disk and wafers on the satellite disk, splitting and converting the reflected laser light into an electrical signal and sampling the electrical signal at a fixed frequency within a time period of two trigger pulse signals to obtain an angle revolved by the planetary susceptor for each sampling. The rotational speed of the satellite disk is obtained by calculating variation between $\phi0$ to $\phi1$, wherein the rotation angle of $\phi0$ is obtained when the edge of the wafer enters a viewport, and $\phi1$ is calculated when the edge of the same wafer leaves the viewport.

7 Claims, 5 Drawing Sheets

METHOD AND APPARATUS FOR MEASURING ROTATIONAL SPEED OF SATELLITE DISK ON MOCVD PLANETARY SUSCEPTOR

CROSS-REFERENCE TO RELATED APPLICATIONS

The present disclosure is a national stage of International Application No. PCT/CN2021/131750 filed on Nov. 19, 2021, which claims priority to Chinese Patent Application No. 202110775866.X filed on Jul. 9, 2021. The disclosures of the above-referenced applications are hereby incorporated by reference in their entirety.

TECHNICAL FIELD

This disclosure relates to the technical field of MOCVD equipment, specifically to a method and an apparatus for measuring a rotational speed of a satellite disk on a MOCVD planetary susceptor.

BACKGROUND

Metal Organic Chemical Vapor Deposition (MOCVD) equipment is a major element in producing LEDs and compound semiconductors. In a chamber of the equipment, there is a large rotating graphite disk, i.e., planetary susceptor, on which there are multiple small graphite disks, i.e., satellite disks, which are rotating. The planetary susceptor is driven by a motor, the speed of which is controllable, and can send out one trigger pulse signal per revolution, which is then used for synchronization and speed measurement. Each of the satellite disks are rotated by airflow, and the rotational speed is adjusted by adjusting the airflow. Multiple wafers can be placed on each satellite disk. The chamber heats the wafer to a certain temperature, and organic chemical gas is introduced to generate a chemical reaction, depositing products on the surface of the wafer. By controlling the composition and insertion of the gas, thin film layers required for the semiconductor device are grown.

The temperature consistency of the wafer in the process is very important to the yield of production, and the rotational speed of the satellite disk driven by the airflow can have an impact on its own temperature and the temperature of the wafer. Although the rotational speed of the satellite disk can be adjusted by airflow, before the present disclosure, the rotational speed of the satellite disk could not be accurately known.

SUMMARY

The purpose of the present disclosure is to provide a method and apparatus for measuring a rotational speed of a satellite disk on a MOCVD planetary susceptor to solve the above-mentioned problem.

In order to achieve the objective above, in the first aspect, according to some embodiments of the present disclosure, the following technical solutions are provided.

A method for measuring a rotational speed of a satellite disk on a MOCVD planetary susceptor is provided. The method includes emitting a beam of laser light from a laser detection probe on an MOCVD equipment; the laser light irradiating on a planetary susceptor of the MOCVD equipment, and as the planetary susceptor is revolving, the laser light also irradiates on satellite disks and wafers found on said satellite disks, splitting and converting reflected laser light into an electrical signal and sampling the electrical signal at a fixed frequency f within a time period of two trigger pulse signals to obtain an angle $\Delta\alpha$ revolved by the planetary susceptor for each sampling. In reference to the angle $\Delta\alpha$, a rotation angle $\phi 0$ of the satellite disk is calculated the moment when the edge of the wafer enters a viewport. Similarly, when the edge of said wafer leaves the viewport, a rotation angle $\phi 1$ of the satellite disk is calculated in reference to the angle $\Delta\alpha$, obtaining a rotational speed of a satellite disk by calculating variation between the rotation angle $\phi 0$ and the rotation angle $\phi 1$.

In some embodiments, the laser detection probe is installed on the viewport of the MOCVD equipment, providing a signal regarding the revolution of the planetary susceptor, and outputs one trigger pulse signal for one revolution of the planetary susceptor.

In some embodiments, the satellite disk and the planetary susceptor are made of the same material and do not reflect laser light while the wafer reflects laser light.

In some embodiments, the reflected laser light is irradiated on a detector through a beam splitter and converted into the electrical signal. The electrical signal is then collected by a multi-channel synchronous data acquisition card.

In some embodiments, the sampling is performed at the fixed frequency f, and a total of L lines of data are sampled within the time period of two trigger pulse signals. The angle $\Delta\alpha$ revolved by the planetary susceptor for each sampling is $\Delta\alpha=360/L$. A sampling point at the moment the edge of the wafer enters the viewport, a sampling point at the moment the edge of said wafer leaves the viewport and a sampling point at the center of satellite disk are determined by analyzing the sampled data, so as to obtain times of sampling (L0) between the sampling point at the moment of entering and the sampling point for the center of satellite disk and times of sampling (L1) between the sampling point at the moment of leaving and the sampling point for the center of satellite disk.

In some embodiments, the rotation angle of the satellite disk $\phi 0=\gamma 0-\beta 0$, wherein, $$\gamma 0 = \arcsin[(dv * \sin\alpha 0)/a],\ \beta 0 = \arccos\left[\frac{(a^2 + dw^2 - Rwafer^2)}{2adw}\right]$$

and, according to the Law of Cosines formula, $$a = (dv^2 + ds^2 - 2dv * ds * \cos\alpha 0)1/2.$$

The rotation angle of the satellite disk $\phi 1=\gamma 1-\beta 1$, wherein, $$a = (dv^2 + ds^2 - 2dv * ds * \cos\alpha 1)\frac{1}{2},\ \gamma 1 = \arcsin[(dv * \sin\alpha 1)/a],$$

$$\beta 1 = \arccos\left[\frac{(a^2 + dw^2 - Rwafer^2)}{2adw}\right],\ \alpha 1 = L1 * \Delta\alpha = 360 * L1/L$$

and b=a radius of the wafer, i.e., Rwafer, where dv, ds and dw are known variables, respectively representing a distance from the viewport to a center of the planetary susceptor, a distance from a center of the satellite disk to the center of the planetary susceptor, and a distance from a center of wafer to the center of the satellite disk. Angle $\alpha$ is an included angle between a line from the viewport to the center of the planetary susceptor and a line from the center of satellite disk to the center of the planetary susceptor. Angle $\beta$ is an included angle between a line from the center of satellite disk to the viewport and a line from the center of the wafer to the center of the satellite disk, and angle $\gamma$ is an included angle between the line from the viewport to the center of the satellite disk and the line from the center of the satellite disk to the center of the planetary susceptor. a is the distance from the center of the satellite disk to the viewport, b is a distance from the center of the wafer to the viewport, and angle $\phi$ is an included angle between the line from the center of wafer to the center of the satellite disk and the line from the center of satellite disk to the center of the planetary susceptor.

In some embodiments, when the rotation angle of the satellite disk for each sampling is $$\Delta\phi = \frac{(\phi 1 - \phi 0)}{(L0 - L1)},$$

the rotational speed of the satellite disk m, i.e., the rotation per minute (RPM)=the times of samples per minute (f×60 seconds) multiplied by the angle rotated by each sampling ($\Delta\phi$) divided by 360 degrees, which is $m=f\times 60\times\Delta\phi/360=f\times\Delta\phi/6$.

In order to achieve the objective described above, the following technical solutions are also provided according to some embodiments of the present disclosure.

An apparatus for measuring a rotational speed of a satellite disk on a MOCVD planetary susceptor is provided. The apparatus includes: a laser detection probe mounted on a viewport of a MOCVD equipment and configured to emit a beam of laser light onto a rotating planetary susceptor, a satellite disk and wafers; a beam splitter configured to split and irradiate reflected laser light onto a photodetector to convert an optical signal into an electrical signal, and a multi-channel synchronous data acquisition card configured to obtain the rotational speed of the satellite disk by synchronously reading the electrical signal outputted the photodetector and trigger pulse signals, sending the electrical signal and the trigger pulse signals to a computer for analysis and calculation. The planetary susceptor is mounted on the MOCVD equipment, the satellite disk affixed on the planetary susceptor and wafers affixed on the satellite disk.

In some embodiments, the laser measurement probe is mainly composed of a collimated laser and a detector, wherein the detector is a photodetector or a position sensing detector.

In some embodiments, the collimated laser, the beam splitter, and the detector are in the same optical path.

In the present disclosure, the rotational speed of the satellite disk is calculated by emitting a beam of laser light onto the planetary susceptor using the detection probe consisting of a collimated laser and a photodetector, collecting the reflected laser signal intensity, distinguishing the edge of the satellite disk and the edge of the wafer on the satellite disk through a special algorithm, and calculating the included angle between the line from the center of the wafer to the center of the satellite disk and the line from the center of the satellite disk to the center of the planetary susceptor.

The method of the present disclosure is suitable for a situation in which the rotational speed of the satellite disk is greater than the revolution speed of the planetary susceptor, and the number of wafers on the satellite disk is greater than or equal to two.

Figure 1:
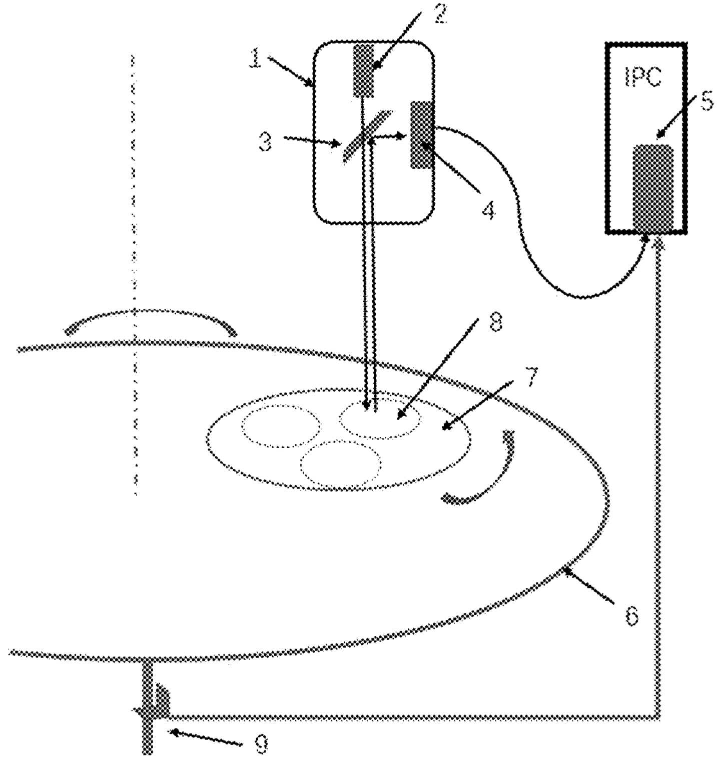
FIG. 1 is a schematic diagram of an apparatus according to an embodiment of the present disclosure.

In the drawings: 1—laser detection probe; 2—collimating laser; 3—beam splitter; 4— photo detector; 5—multi-channel synchronous acquisition card; 6—planetary susceptor; 7—satellite disk; 8—wafer; 9—trigger pulse signal.

DETAILED DESCRIPTION

The technical solutions in the embodiments of the present disclosure will be clearly and completely described below with reference to the accompanying drawings in the embodiments of the present disclosure. Evidently, the described embodiments are only a part of the embodiments of the present disclosure, rather than all embodiments. Based on the embodiments in the present disclosure, all other embodiments created by those of ordinary skill in the art without creative effort shall fall within the protection scope of the present disclosure.

Referring to FIGS. 1 to 5, according to some embodiments of the present disclosure, a method and apparatus for measuring a rotational speed of a satellite disk on a MOCVD planetary susceptor is provided. As shown in FIG. 1, a viewport of a MOCVD equipment is installed with a laser detection probe 1 to emit a beam of laser light, which irradiates on a planetary susceptor 6 of the MOCVD equipment. The reflected laser light irradiates on a photodetector 4 or a position sensing detector through a beam splitter 3, and a signal output by the detector is passed through a cable, transmitting into a multi-channel synchronous data acquisition card 5 in a computer. A measurement software is then run in the computer.

The MOCVD equipment may provide the signal regarding the revolution of the planetary susceptor 6, and output one trigger pulse signal when the planetary susceptor revolves one circle. The trigger pulse signal is transmitted to the multi-channel synchronous data acquisition card 5 in the computer through the cable, and the software in the computer reads the electrical signal outputted by photodetector 4 and the trigger pulse signals 9 synchronously.

The computer may calculate the revolution speed of the planetary susceptor 6 by calculating intervals in the trigger pulse signals 9.

The laser light is irradiated on the planetary susceptor 6, and as the planetary susceptor 6 revolves, the laser light will also be irradiated on one or more satellite disks 7, on wafers 8 on the satellite disk 7, and on gaps between the wafers 8 on the satellite disk 7. The satellite disk 7 and the planetary susceptor 6 can be made of a graphite material, which hardly reflects laser light with a reflected signal intensity close to zero. The wafers 8 on the satellite disk 7 reflect the laser beam, and as the epitaxial growth process proceeds, the reflection intensity will change, but it is much higher than that of the graphite disk. Therefore, by using the high-sensitivity photodetector 4 or the position sensing detector with an intensity measurement function, the intensity of the received laser signal can be analyzed. Whether the laser light is irradiated on the wafers 8, on the satellite disk 7 or on the planetary susceptor 6 can be distinguished due to the differences of the reflected laser signal strength from the satellite disks and the wafers. That is, according to the intensity of the laser, it can be determined which sampled data is the data of the satellite disk and which sampled data is the data of the wafer.

Figure 2:
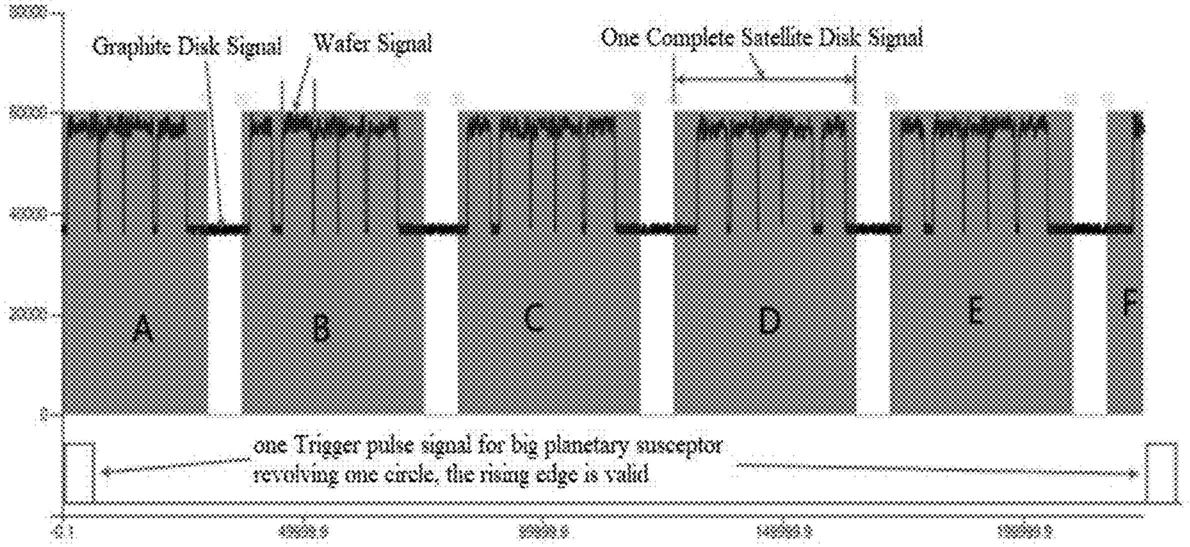
FIG. 2 is a schematic diagram of signal data for one revolution of a planetary susceptor collected by a synchronous data acquisition card according to an embodiment of the present disclosure.

The signal that a computer may collect through the multi-channel synchronous acquisition card 5 is as shown in FIG. 2. The software intercepts data between pulses of two trigger pulse signals 9, obtaining the measurement data for one revolution of the planetary susceptor 6.

The number and arrangement of the satellite disks 7 on the planetary susceptor 6 are known. The revolution of the planetary susceptor 6 is driven by a motor. There are two ways of obtaining the trigger pulse signals 9. One is from a driver of the motor, and the other is to install a photoelectric switch on the motor shaft. Either way, the phase relationship between trigger pulse signals 9 and revolution of the planetary susceptor 6 is fixed, and positions of the satellite disks 7 are fixed on the planetary susceptor 6. Therefore, according to the arrangement data of the satellite disks 7 and the phase relationship between the trigger pulse signals 9 and the satellite disks 7, the signal of each of the satellite disks 7 can be distinguished from the collected signal of one revolution of the planetary susceptor 6, shown in areas A, B, C, D, E and F in FIG. 2, and the location of the sampling signal at the center of each satellite disk can be known.

Based on the signal strength, the software can distinguish the edge of each wafer 8.

Figure 3:
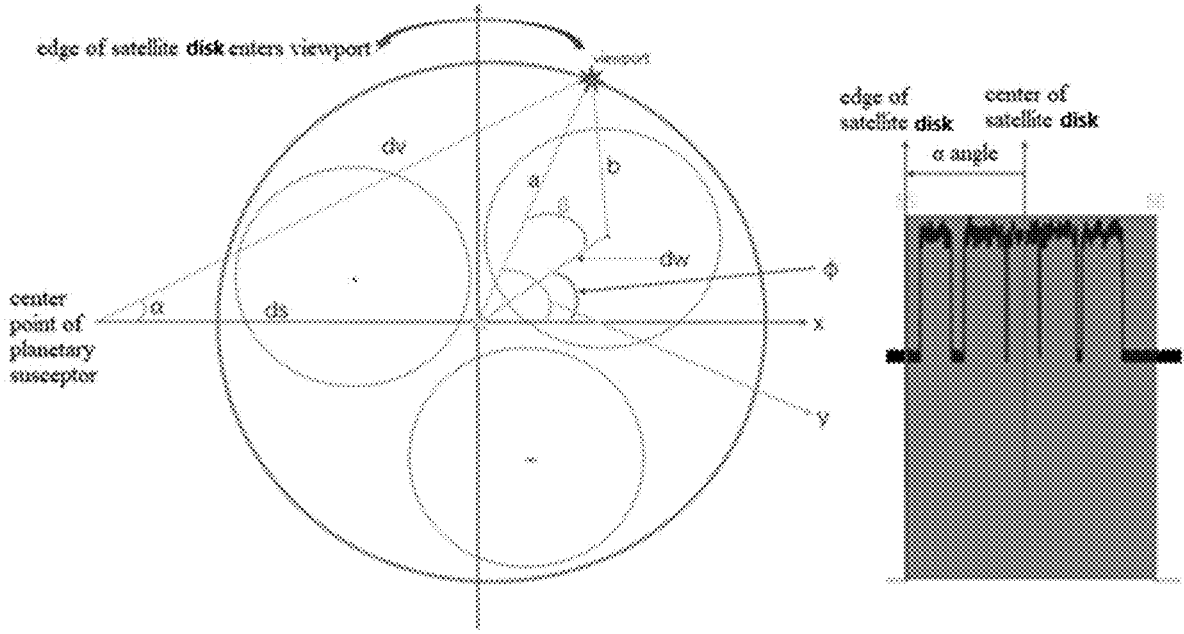
FIG. 3 is a schematic diagram of the moment when a satellite disk enters the viewport according to an embodiment of the present disclosure.

In some embodiments, the algorithm is as follows:

1, as shown in FIG. 3, a planetary susceptor 6 revolves, i.e., revolution, and a satellite disk 7 rotates by itself, i.e., rotation. Wafers 8 on the satellite disk 7 are fixed relative to the satellite disk 7, and the included angle @ between a line from the center of each wafer 8 to the center of satellite disk 7 and a line from the center of satellite disk 7 to the center of planetary susceptor 6 is a rotation angle irrelevant to the revolution. Therefore, the rotational speed of the satellite disk 7 can be calculated by calculating the variation of the angle $\phi$.

As shown in FIG. 3, because the position of the viewport and detection probe is immobile, 1) dv is the distance from the viewport to the center of the planetary susceptor 6, which is a known variable, wherein the viewport is also called a measurement port;
2) ds is the distance from the center of the satellite disk to the center of the planetary susceptor 6, which is a known variable;
3) dw is the distance from the center of the wafer to the center of the satellite disk, which is a known variable;
4) angle $\alpha$ is an included angle between the line from the viewport to the center of the planetary susceptor 6 and the line from the center of the satellite disk to the center of the planetary susceptor 6, which is only related to the revolution of the planetary susceptor 6;
5) angle $\beta$ is an included angle between the line from the center of the satellite disk 7 to the viewport and the line from the center of the wafer 8 to the center of the satellite disk, which is related to both the revolution of the planetary susceptor 6 and the rotation of the satellite disk 7;
6) angle $\gamma$ is an included angle between the line from the viewport to the center of the satellite disk and the line from the center of the satellite disk to the center of the planetary susceptor 6, which is only related to the revolution of the planetary susceptor 6;
7) a is the distance from the center of the satellite disk to the viewport, which is only related to the revolution of the planetary susceptor 6 and can be calculated;
8) b is the distance from the center of wafer to the viewport, which is related to both the revolution of the planetary susceptor 6 and the rotation of the satellite disk;
9) angle $\phi$ is an included angle between the line from the center of the wafer to the center of the satellite disk and the line from the center of the satellite disk to the center of the planetary susceptor 6, which is only related to the rotation of the satellite disk;
10) $\phi=\gamma-\beta$, a variation of angle $\phi$, is calculated to obtain the rotational speed of the satellite disk.

2, when L rows of data are sampled by the data acquisition card with a fixed frequency f within a time period of two trigger pulses to obtain one complete revolution sampling signal, then the angle $\Delta\alpha$ revolved by the planetary susceptor for each sampling is $\Delta\alpha=360/L$.

Figure 4:
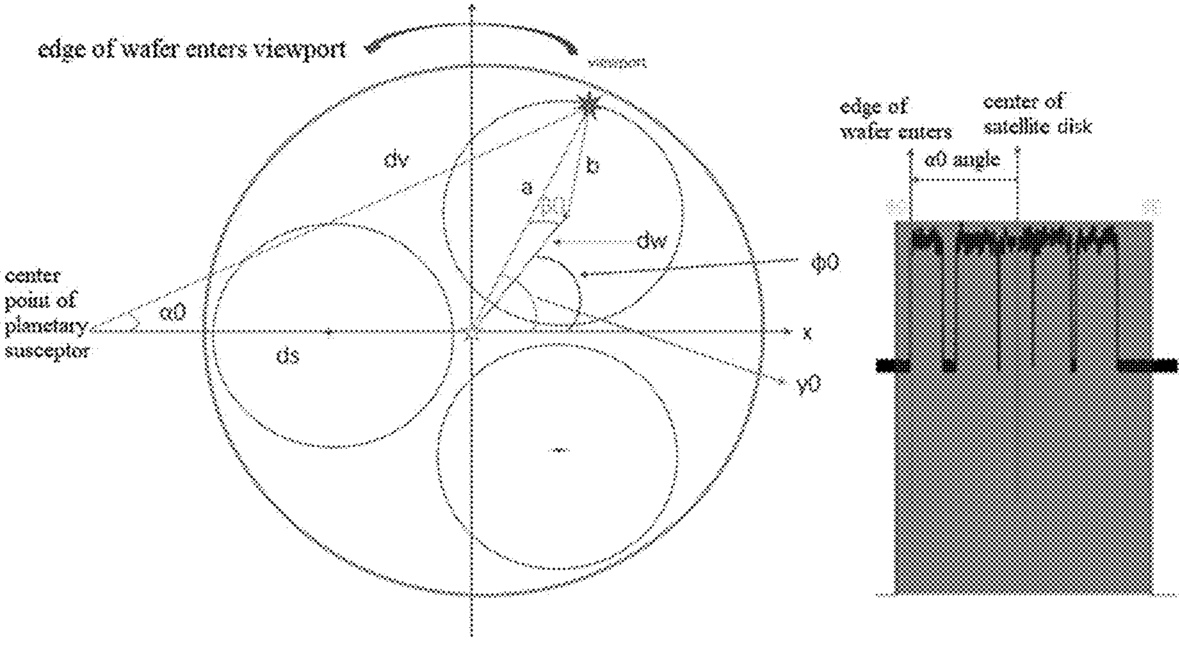
FIG. 4 is a schematic diagram of the moment when a wafer enters the viewport according to an embodiment of the present disclosure.

3, as shown in FIG. 4, by analyzing the sampled data, the sampling point at the moment the edge of the wafer enters the viewport can be determined, and so times of sampling (L0) between the sampling point at the moment of entering the viewport and the sampling point at the center of the satellite disk can be obtained, i.e., the time length between them. Therefore, $$\alpha 0 = L0 * \Delta\alpha = 360 * L0/L,$$

dv and ds are known variables, which can be obtained according to the Law of Cosines formula $$a = \left(dv^2 + ds^2 - 2dv * ds * \cos\alpha 0\right)\frac{1}{2}$$

$$\gamma 0 = \arcsin[(dv * \sin\alpha 0)/a]$$

at this moment, the viewport is just at the edge of the wafer, so b=the radius of the wafer, i.e., Rwafer, which is a known variable, then $$\beta 0 = \arccos\left[\frac{\left(a^2 + dw^2 - Rwafer^2\right)}{2\,adw}\right],$$

allowing the rotation angle $\phi 0$ at this moment to be calculated:

$$\phi 0 = \gamma 0 - \beta 0.$$

Figure 5:
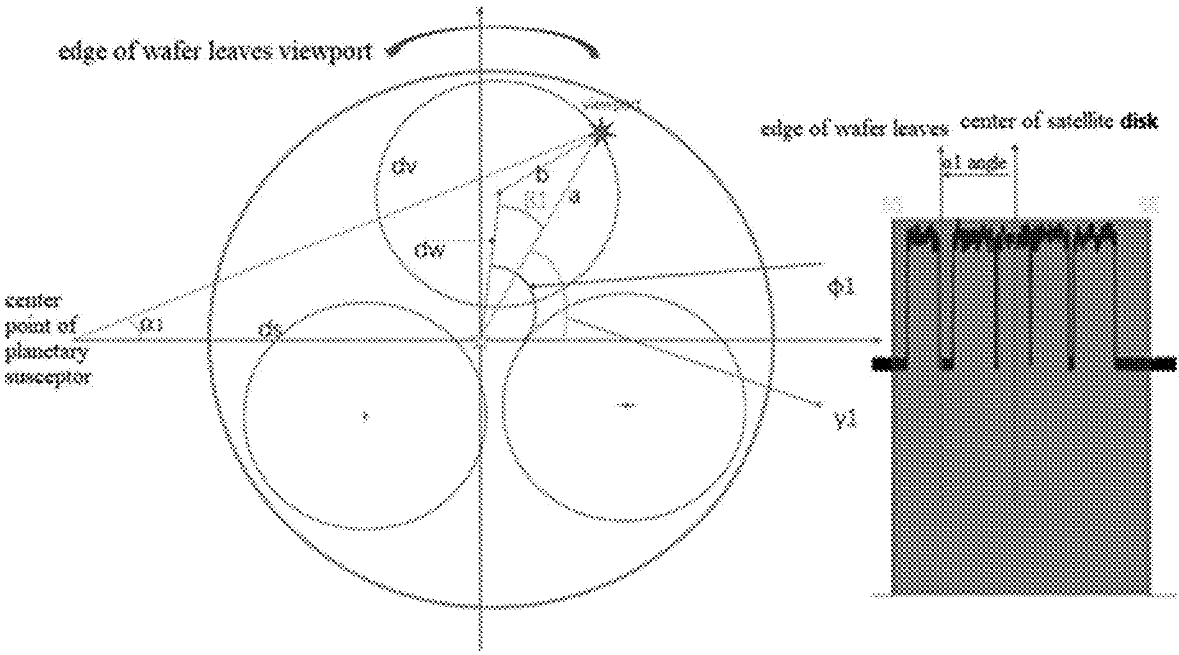
FIG. 5 is a schematic diagram of the moment when a wafer leaves the viewport according to an embodiment of the present disclosure.

4, as shown in FIG. 5, by analyzing the sampled data, the sampling point at the moment the same wafer leaves the viewport can be determined, and the times of sampling (L1) between the sampling point at the moment of leaving and the sampling point at the center of the satellite disk can also be obtained, i.e., the time length between them, then:

$$\alpha 1 = L1 * \Delta\alpha = 360 * L1 / L$$

$$a = (dv^2 + ds^2 - 2dv * ds * \cos\alpha 1)1/2$$

$$\gamma 1 = \arcsin[(dv * \sin\alpha 1)/a]$$

$$\beta 1 = \arccos\left[\frac{(a^2 + dw^2 - Rwafer^2)}{2adw}\right]$$

$$\phi 1 = \gamma 1 - \beta 1$$

5. Because the times of sampling from the edge of the same wafer entering the viewport to leaving the viewport are L0-L1, the angle rotated by the satellite disk is ϕ1-ϕ0, and the angle rotated by the satellite disk for each sampling is $$\Delta\phi = \frac{(\phi 1 - \phi 0)}{(L0 - L1)},$$

then the rotational speed of the satellite disk m can be obtained by dividing the angle variation by the elapsed time, i.e., Rotation Per Minute (RPM)=times of sampling per minute (f×60 seconds) multiplied by the angle rotated by each sampling (Δϕ) divided by 360 degrees, which is m=f×60×Δϕ/360=f×Δϕ/6.

In the present disclosure, a beam of laser light is emitted onto the planetary susceptor through a detection probe composed of a collimated laser 2 and a photodetector 4, collecting the reflected laser signal intensity. Using a special algorithm, the edge of satellite disk and the edge of wafer on the satellite disk can be distinguished, and then the rotational speed of the satellite disk is calculated by calculating the included angle between the line from the center of the wafer to the center of the satellite disk and the line from the center of the satellite disk to the center of the planetary susceptor. This method is suitable for the situation in which the rotational speed of the satellite disk is greater than the revolution speed of the planetary susceptor 6 and the number of wafers on the satellite disk is greater than or equal to two.

Although embodiments of the present disclosure have been shown and described, it will be understood by those skilled in the art that various changes, modifications, substitutions, and alterations can be made without departing from the principles of the present disclosure. The scope of the present disclosure is defined by the appended claims and their equivalents.

What is claimed is:

1. A method for measuring a rotational speed of a satellite disk on a MOCVD planetary susceptor, comprising following steps:

emitting a beam of laser light from laser detection probe (1) on an MOCVD equipment;

irradiating the laser light on a planetary susceptor (6) of the MOCVD equipment, and as the planetary susceptor (6) revolves, the laser light also irradiating on a satellite disk (7) and wafers (8) on the satellite disk (7);

splitting and converting reflected laser light into an electrical signal;

sampling the electrical signal at a fixed frequency f within a time period of two trigger pulse signals (9) to obtain an angle Aa revolved by the planetary susceptor (6) for each sampling;

in reference to the angle Δα, calculating a rotation angle ϕ0 of the satellite disk at a moment when an edge of a wafer (8) enters a viewport;

in reference to the angle Δα, calculating a rotation angle ϕ1 of the satellite disk at a moment when the edge of the same wafer (8) leaves the viewport; and obtaining a rotational speed of the satellite disk (7) by calculating variation between the rotation angle ϕ0 and the rotation angle ϕ1.

2. The method according to claim 1, wherein the laser detection probe (1) is installed on the viewport of the MOCVD equipment, the MOCVD equipment provides a trigger pulse signal (9) about revolution of the planetary susceptor (6) and outputs one trigger pulse signal (9) per revolution.

3. The method according to claim 1, wherein the satellite disk (7) and the planetary susceptor (6) are made of a same material and do not reflect the laser light, while the wafer (8) reflects the laser light.

4. The method according to claim 1, wherein the reflected laser light is irradiated on a detector through a beam splitter (3) and converted into the electrical signal, and the electrical signal is collected by a multi-channel synchronous data acquisition card (5).

5. The method according to claim 1, wherein the sampling is performed at the fixed frequency f and a total of L lines of data are sampled within the time period of two trigger pulse signals, the angle Δα revolved by the planetary susceptor (6) for each sampling is Δα=360/L; a sampling point at the moment the edge of the wafer enters the viewport, a sampling point at the moment of the edge of said wafer leaves the viewport and a sampling point at the center of the satellite disk are determined by analyzing the sampled data, so as to obtain times of sampling (L0) between the sampling point at the moment the edge of the wafer enters the viewport and the sampling point at the center of the satellite disk, and times of sampling (L1) between the sampling point at the moment the edge of said wafer leaves the viewport and the sampling point at center of the satellite disk.

6. The method according to claim 5, wherein, the rotation angle of the satellite disk ϕ0=γ0−β0, wherein $$\gamma 0 = \arcsin[(dv * \sin\alpha 0)/a],\ \beta 0 = \arccos\left[\frac{(a^2 + dw^2 - Rwafer^2)}{2adw}\right],$$

and according to the Law of Cosines formula, $$a = (dv^2 + ds^2 - 2dv * ds * \cos\alpha 0)\frac{1}{2};$$

the rotation angle of the satellite disk ϕ1=γ1−β1, wherein $$a = (dv^2 + ds^2 - 2dv * ds * \cos\alpha 1)\frac{1}{2},\ \gamma 1 = \arcsin[(dv * \sin\alpha 1)/a],$$

$$\beta 1 = \arccos\left[\frac{(a^2 + dw^2 - Rwafer^2)}{2adw}\right],\ \alpha 1 = L1 * \Delta\alpha = 360 * L1/L,$$

b=a radius of the wafer (Rwafer), wherein, dv, ds and dw are known variables, respectively representing a distance from the viewport to a center of the planetary susceptor (6), a distance from a center of the satellite disk (7) to the center of the planetary susceptor (6), and a distance from a center of the wafer (8) to the center of the satellite disk (7);

angle $\alpha$ is an included angle between a line from the viewport to the center of the planetary susceptor (6) and a line from the center of the satellite disk (7) to the center of the planetary susceptor (6);

angle $\beta$ is an included angle between a line from the center of the satellite disk (7) to the viewport and a line from the center of the wafer (8) to the center of the satellite disk (7), and the angle $\gamma$ is an included angle between the line from the viewport to the center of the satellite disk (7) and the line from the center of the satellite disk (7) to the center of the planetary susceptor (6);

a is a distance from the center of the satellite disk (7) to the viewport;

b is a distance from the center of the wafer (8) to the viewport; and angle $\phi$ is an included angle between the line from the center of the wafer (8) to the center of the satellite disk (7) and the line from the center of the satellite disk (7) to the center of the planetary susceptor (6).

7. The method according to claim 6, wherein the rotation angle of the satellite disk for each sampling is $$\Delta\phi = \frac{(\phi 1 - \phi 0)}{(L0 - L1)},$$

the rotational speed of the satellite disk (7) is m=times of sampling per minute (f×60 seconds) multiplied by the angle rotated by each sampling ($\Delta\phi$) divided by 360 degrees, which is $m=f\times60\times\Delta\phi/360=f\times\Delta\phi/6$.

* * * * *